United States Patent
Ketzer et al.

(10) Patent No.: US 10,886,675 B2
(45) Date of Patent: Jan. 5, 2021

(54) MEASUREMENT EQUIPMENT, HF COAXIAL CONNECTION ELEMENT AND TORQUE LIMITER FOR AN HF COAXIAL CONNECTION ELEMENT

(71) Applicant: Rohde & Schwarz GmbH & Co. KG, Munich (DE)

(72) Inventors: Stefan Ketzer, Geiersthal (DE); Martin Peschke, Vaterstetten (DE); Alexander Kunze, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/555,188

(22) Filed: Aug. 29, 2019

(65) Prior Publication Data
US 2020/0076140 A1 Mar. 5, 2020

(30) Foreign Application Priority Data
Aug. 30, 2018 (EP) ..................................... 18191767

(51) Int. Cl.
*H01R 24/40* (2011.01)
*F16D 7/00* (2006.01)
(Continued)

(52) U.S. Cl.
CPC ............. *H01R 24/40* (2013.01); *F16D 7/007* (2013.01); *H01R 43/26* (2013.01); *H01R 2103/00* (2013.01)

(58) Field of Classification Search
CPC .... H01R 24/40; H01R 43/26; H01R 2103/00; H01R 4/301; H01R 13/639; H01R 9/05;
(Continued)

(56) References Cited

U.S. PATENT DOCUMENTS 3,343,852 A * 9/1967 Blight .................. H01R 13/621
285/82
3,587,032 A * 6/1971 Normann ............. H01R 13/621
439/321
(Continued)

FOREIGN PATENT DOCUMENTS

AT 381 595 B 11/1986
EP 2505868 A2 10/2012

OTHER PUBLICATIONS

Extended European search report for European Patent Application No. 18191767.5, dated Mar. 18, 2019, 8 pages.

*Primary Examiner* — Travis S Chambers
(74) *Attorney, Agent, or Firm* — Westman, Champlin & Koehler, P.A.

(57) ABSTRACT

A measurement equipment configured to be connected to a measurement device and an HF coaxial connection element and a torque limiter. The torque limiter is configured for connecting the HF coaxial connection element with the measurement device with a predetermined torque. Furthermore, the invention provides an HF coaxial connection element configured to be connected to a corresponding HF coaxial connection element. The HF coaxial connection element comprises a torque limiter configured for detachably connecting the HF coaxial connection element with the corresponding HF coaxial connection element with a predetermined torque, a centering element for centering the HF coaxial connection element with respect to the corresponding HF coaxial connection element and a twist protection element for preventing twisting motion between the HF coaxial connection element and the corresponding HF coaxial connection element. A corresponding torque limiter is also provided.

19 Claims, 4 Drawing Sheets

(51) Int. Cl.
*H01R 43/26* (2006.01)
*H01R 103/00* (2006.01)

(58) Field of Classification Search
CPC ......... H01R 24/38; F16D 7/007; F16B 31/02; G01R 1/0416
USPC ................ 439/583, 312, 319, 321, 322, 578
See application file for complete search history.

(56) References Cited

U.S. PATENT DOCUMENTS

| | | | |
|---|---|---|---|
| 4,046,052 A | 9/1977 | Nordstrom | |
| 5,186,060 A | 2/1993 | Marlier | |
| 5,653,605 A * | 8/1997 | Woehl ................. | H01R 13/622 439/321 |
| 8,123,554 B2 * | 2/2012 | Leipold ................. | H01R 9/05 439/17 |
| 8,333,611 B2 * | 12/2012 | Perndl ................. | H01R 4/625 439/578 |
| 8,893,862 B2 | 11/2014 | Malki et al. | |
| 2006/0043809 A1 * | 3/2006 | Lau ................. | H01R 35/04 310/91 |
| 2009/0133980 A1 | 5/2009 | Swaim et al. | |
| 2012/0115347 A1 * | 5/2012 | Nickel ................. | H01R 13/639 439/345 |
| 2013/0256076 A1 | 10/2013 | Malki et al. | |
| 2016/0299172 A1 | 10/2016 | Patel et al. | |
| 2017/0271825 A1 | 9/2017 | Roe et al. | |
| 2018/0083384 A1 * | 3/2018 | Burns ................. | H01R 13/622 |
| 2019/0123487 A1 * | 4/2019 | Norland ............... | H01R 13/622 |

\* cited by examiner

MEASUREMENT EQUIPMENT, HF COAXIAL CONNECTION ELEMENT AND TORQUE LIMITER FOR AN HF COAXIAL CONNECTION ELEMENT

CROSS-REFERENCE TO RELATED APPLICATION

This application claims priority to European Patent Application No. 18191767.5, filed Aug. 30, 2018, the content of which is hereby incorporated by reference.

FIELD OF THE INVENTION

The present invention relates to a measurement equipment configured to be connected to a measurement device and to an HF coaxial connection element configured to be connected to a corresponding HF coaxial connection element. The present invention also relates to a torque limiter for an HF coaxial connection element.

BACKGROUND OF THE INVENTION

In measurement systems and especially in HF measurement systems, coaxial connectors are usually screwed and have to be tightened with a predetermined torque in order to meet specified connection values such as reflection loss (RL) or insertion loss (IL). Therefore, connectors usually comprise an outer coupling nut. Furthermore, locking brackets are known for preventing loosening or unscrewing of the coaxial connectors. US 2016/0299172 A1 describes such a coaxial connector comprising a coupling nut and a locking bracket supporting the nut.

SUMMARY OF THE INVENTION

There is a need to provide a new and improved connection for measurement equipment and HF coaxial connection elements.

The present invention provides a measurement equipment, an HF coaxial connection element and a torque limiter comprising the features as defined in each one of the independent claims.

Advantageous or preferred features are recited in the dependent claims.

According to one aspect of the invention, therefore, the present invention provides a measurement equipment configured to be connected to a measurement device. The measurement equipment comprises an HF coaxial connection element and a torque limiter. The torque limiter is configured for connecting the HF coaxial connection element with the measurement device with a predetermined torque.

This way, the invention provides a measurement equipment which is configured for safe connection with a predetermined torque without any further tool. The measurement equipment comprises an integrated torque limiter and thus may be easily and directly fastened by hand with the predetermined torque. In particular, a thread of the HF coaxial connection element of the measurement equipment can be connected to a counter thread of the measurement device with a predetermined torque.

In particular, the torque limiter is configured adjustable to calibrate the predetermined torque, for example to be connected to different measurement devices. In this way, the measurement equipment may be used for measurement instruments, for example an oscilloscope, a power meter, frequency counter, spectrum analyser, network analyser and/or the like.

Accordingly, the measurement equipment may comprise a sensor or probe for collecting data in form of an HF signal, for example a frequency signal, power signal, network signal, or the like.

In an embodiment, the measurement equipment further comprises a thread and the torque limiter is configured for tightening the thread with a counterpart thread of the measurement device. In this way, conventional threaded connectors of existing measurement devices may be used for connection with the measurement equipment.

According to an embodiment, the torque limiter is configured as an overrunning clutch. In particular, the overrunning clutch, comprises an overrunning turning direction for closing the connection with the predetermined torque and a blocking turning direction for opening the connection. The clutch is configured to open when the torque limiter is turned in the overrunning direction of the overrunning clutch and the predetermined torque is reached. In this way the connection may be easily closed. The connection may be opened again by turning the torque limiter in the blocking direction of the overrunning clutch. In the blocking direction, the overrunning clutch allows transmission of higher torque such that the connection can be easily opened in the blocking direction, even if a higher torque is needed to loosen the connection.

According to an embodiment, the torque limiter is configured as a slip clutch. In particular, a slip clutch allows slipping in both turning directions of the torque limiter. However, the torque transmittable in a closing direction may be different from the torque transmittable in an opening direction. In this way, the predetermined torque can be applied in a closing direction to close the connection and a higher torque may be applied in an opening direction, if necessary, to open the connection.

According to an embodiment, the torque limiter is configured as a ball or roller detent type limiter. A ball or roller detent type limiter transmits force through pressing ratchet parts, such as balls or rollers, in particular hardened metallic balls, which rest in detent depressions or indentations and are held in place with springs. If a predetermined torque is reached, the balls or rollers are pushed out of the indentations, thereby decoupling the torque limiter. The predetermined torque may be adapted by adjusting the spring compression. The indentations may be configured to allow pushing out the balls or rollers in one or in both directions. This way, both an overrunning clutch and a slipping clutch may be realized by means of such a ball or roller detent type limiter.

According to an embodiment, the HF coaxial connection element and the torque limiter are accommodated together in one housing. In this way, the torque limiter is formed integrated with the HF coaxial connection element. Accordingly, the measurement equipment may be easily handled for closing or opening a connection to the measurement device. Furthermore, the housing prevents misuse like blocking of the torque limiter, or the like.

According to another aspect, the invention provides an HF coaxial connection element configured to be connected to a corresponding HF coaxial connection element. The HF coaxial connection element comprises a torque limiter configured for detachably connecting the HF coaxial connection element with the corresponding HF coaxial connection element with a predetermined torque. Furthermore, the HF coaxial connection element comprises a centering element for centering the HF coaxial connection element with respect to the corresponding HF coaxial connection element. In addition, the HF coaxial connection element comprises a twist protection element for preventing twisting motion between the HF coaxial connection element and the corresponding HF coaxial connection element.

Similar to the measurement equipment, the HF coaxial connection element is configured for easy and safe connection with a predetermined torque without any further tool. The HF coaxial connection element comprises an integrated torque limiter. Furthermore, the HF coaxial connection element may be configured for connection with an HF element, such as any kind of coaxial cable or HF device.

With the integrated centering element and the integrated twist protection element, the HF coaxial connection element may be easily, directly and safely fastened with the predetermined torque to a corresponding HF coaxial connection element by hand.

The centering element is, in particular at least partially, ring shaped. It ensures correct positioning of the connection elements with respect to each other. In particular, a connection between the connection elements with the predetermined torque can even be established one handed, since the twist protection element abuts the applied torque and prevents twisting already for establishing the connection.

In an embodiment, the centering element and the twist protection element are formed together in one part. In this way, a new and integrated connector type is provided that allows in particular an individual form code. In particular, the centering element and the twist protection element can be formed together in one part comprising a keyhole shape. Furthermore, variations of the exact keyhole shape are possible. In this way, corresponding HF coaxial connection elements can be individualized to fit together in shape without changing the connector concept.

According to a further aspect, the present invention provides a torque limiter for an HF coaxial connection element. In particular, the torque limiter is configured for a measurement equipment according to the invention or for an HF coaxial connection element according the invention. The torque limiter comprises a guiding element comprising at least two radially arranged indentations. Furthermore, the torque limiter comprises a pressing component comprising at least two spring preloaded pressing elements and configured for pressing the least two spring preloaded pressing elements against the at least two indentations. The guiding element is configured rotateable around an HF coaxial connection element axis with respect to the pressing component.

The torque limiter is configured for safe connection of an HF coaxial connection element with a predetermined torque without any further tool. The preload of the springs of the pressing component pressing the pressing elements in the indentations defines the predetermined torque. The pressing elements are configured a ratchet elements, such as balls or rollers. If the predetermined torque is reached, the pressing elements are partly pushed out of the indentations and separate a frictional contact between the pressing component and the guiding element such that no or only reduced torque can be transmitted. The pressing elements are thus pushed back into the indentations by the pressing component and the frictional contact between the pressing component and the guiding element is established again.

In an embodiment, the torque limiter further comprises a preloading disc or washer axially movable with respect to the pressing component for adjusting the spring preload on the pressing elements according to a distance to the pressing component. In this way, the torque limiter can be calibrated for various HF coaxial connection elements or connections.

According to an embodiment, the pressing component comprises a centering element with a central hollow shaft configured for centering the HF coaxial connection element, wherein the hollow shaft comprises an outer thread configured for securing and axially moving the preloading disc or washer. In particular, the disc or washer comprises a central bore with an inner thread corresponding to the outer thread of the hollow shaft, such that the disc or washer may be screwed onto the hollow shaft and secured and/or axially moved with respect to the hollow shaft by screwing. In this way, a preload between the pressing component and the guiding element is abutted by the centering element and the disc or washer and can be easily adapted or calibrated.

According to an embodiment, the centering element comprises a flange for abutting the spring preload of the pressing component, wherein the preloading disc or washer is axially movable with respect to the centering element for adjusting the spring preload on the pressing elements according to a distance to the flange. In this way, the centering element and the preloading disc or washer function as a bracket abutting the preloading forces.

BRIEF DESCRIPTION OF THE DRAWINGS

For a more complete understanding of the invention and the advantages thereof, exemplary embodiments of the invention are explained in more detail in the following description with reference to the accompanying drawing figures, in which like reference characters designate like parts and in which.

The accompanying drawings are included to provide a further understanding of the present invention and are incorporated in and constitute a part of this specification. The drawings illustrate particular embodiments of the invention and together with the description serve to explain the principles of the invention. Other embodiments of the invention and many of the attendant advantages of the invention will be readily appreciated as they become better understood with reference to the following detailed description.

It will be appreciated that common and/or well understood elements that may be useful or necessary in a commercially feasible embodiment are not necessarily depicted in order to facilitate a more abstracted view of the embodiments. The elements of the drawings are not necessarily illustrated to scale relative to each other. It will further be appreciated that certain actions and/or steps in an embodiment of a method may be described or depicted in a particular order of occurrences while those skilled in the art will understand that such specificity with respect to sequence is not actually required. It will also be understood that the terms and expressions used in the present specification have the ordinary meaning as is accorded to such terms and expressions with respect to their corresponding respective areas of inquiry and study, except where specific meanings have otherwise been set forth herein.

DETAILED DESCRIPTION OF EMBODIMENTS

Figure 1:
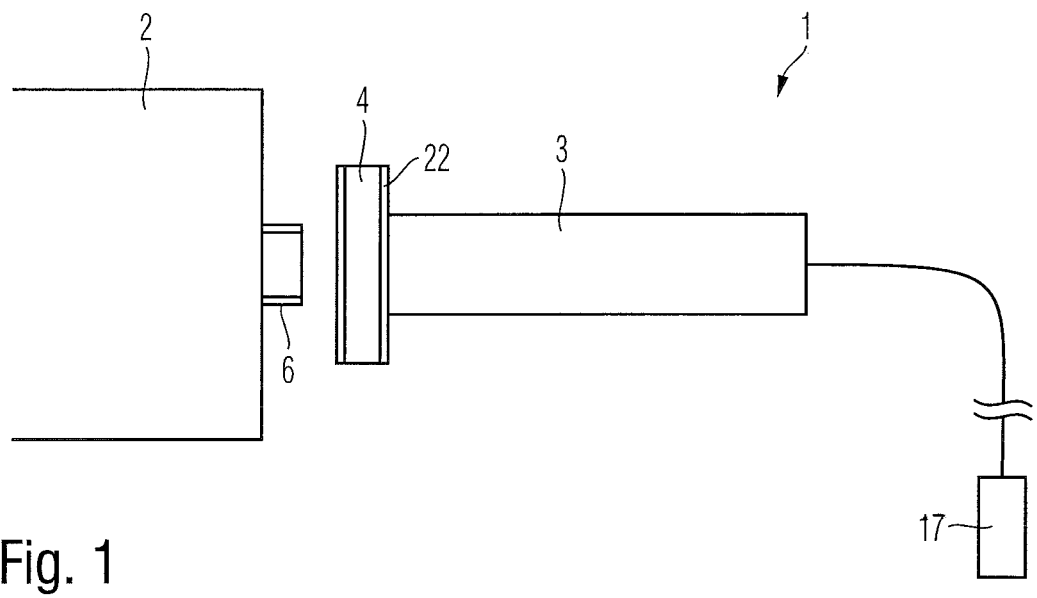
FIG. 1 is a schematic side view of a measurement equipment configured to be connected to a measurement device.

With reference firstly to FIG. 1 of the drawings, a measurement equipment configured to be connected to a measurement device is illustrated schematically in a side view. The measurement equipment 1 includes an HF coaxial connection element 3 and a torque limiter 4 configured for connecting the HF coaxial connection element 3 with the measurement device 2 with a predetermined torque.

Furthermore, a sensor or probe 17 of the measurement equipment is schematically shown on the right hand side and a measurement device 2 is schematically shown on the left hand side.

Figure 2:
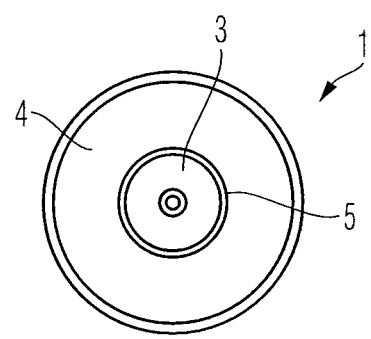
FIG. 2 is a schematic front view of a measurement equipment according to FIG. 1.

FIG. 2 is a schematic front view of a measurement equipment according to FIG. 1.

The measurement equipment 1 comprises a thread 5 configured to be connected to a counter thread 6 of the measurement device 2. The torque limiter 4 is configured for tightening the thread 5 with the counterpart thread 6 of the measurement device 2.

The torque limiter 4 comprises a turning wheel 22 configured for manual operation. By manual operation, a torque is transmitted from the turning wheel to the thread 5 until the predetermined torque is reached. The torque limiter 4 limits the transmitted torque to the predetermined value.

Figure 3:
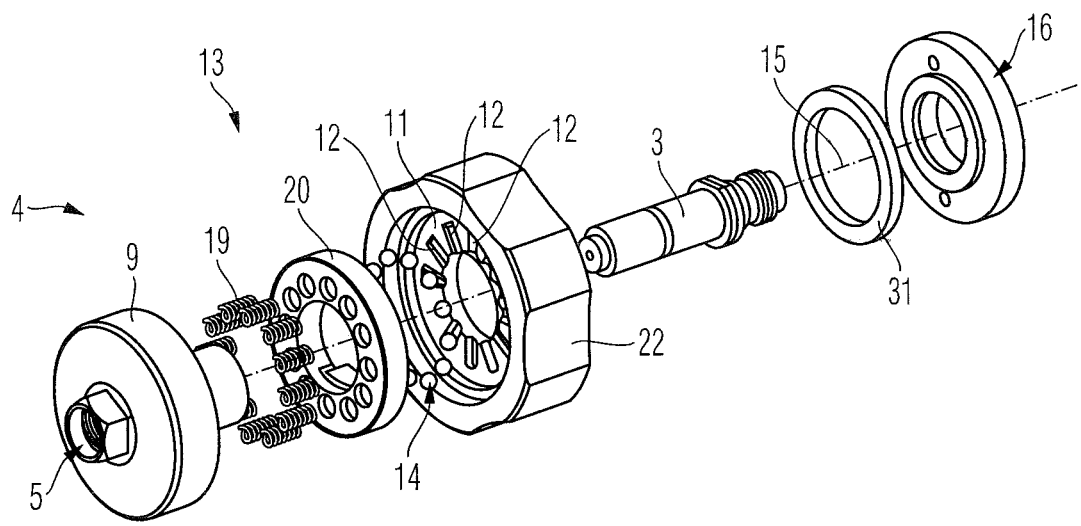
FIG. 3 is a perspective explosion view of a torque limiter for an HF coaxial connection element.

FIG. 3 is a perspective explosion view on a torque limiter 4 for HF coaxial connection element 3 according to an embodiment.

In this embodiment, the torque limiter 4 comprises a guiding element 11 with a plurality of radially arranged indentations 12. For example only, the present embodiment comprises twelve indentations 12. However, in other embodiments, another plurality of at least 2 indentations may be applied, depending on the size of the HF connection element and the configuration of the torque limiter 4.

A pressing component 13 of the torque limiter 4 comprises a corresponding number of preloaded pressing elements 14. In the present embodiment, the pressing elements 14 are configured as preloaded hardened metal balls preloaded by a corresponding number of springs 19. However, other pressing elements 14, such as rollers or the like, other types or other numbers of springs 19, in particular differing from the number of balls, may be used depending on the desired characteristics and torque to be transmitted by the torque limiter 4.

A bearing ring 20 of the pressing component 13 is arranged between the guiding element and the springs 19 and on one side is configured for radially and circumferentially holding the preloaded balls 14 in the indentations. On the other side, the bearing abuts the springs 19 in corresponding recesses. In this way, the pressing component 13 is configured for pressing the spring preloaded balls 14 against the indentations 12.

The guiding element 11, in which the indentations 12 are provided, is configured rotatable with respect to the pressing component 13. An HF coaxial connection element 3 can be accommodated in a central bore of the guiding element 11 and the pressing component 13. The guiding element 11 is thus rotatable around an HF coaxial connection element axis 15.

The torque limiter 4 further comprises a preloading washer 16 axially movable with respect to the pressing component 13 for adjusting the spring preload on the pressing elements 14. Furthermore, a centering element 9 is provided on the opposite distal end of the torque limiter 4 to abut the preload force, as explained in more detail with respect to FIG. 4.

Figure 4:
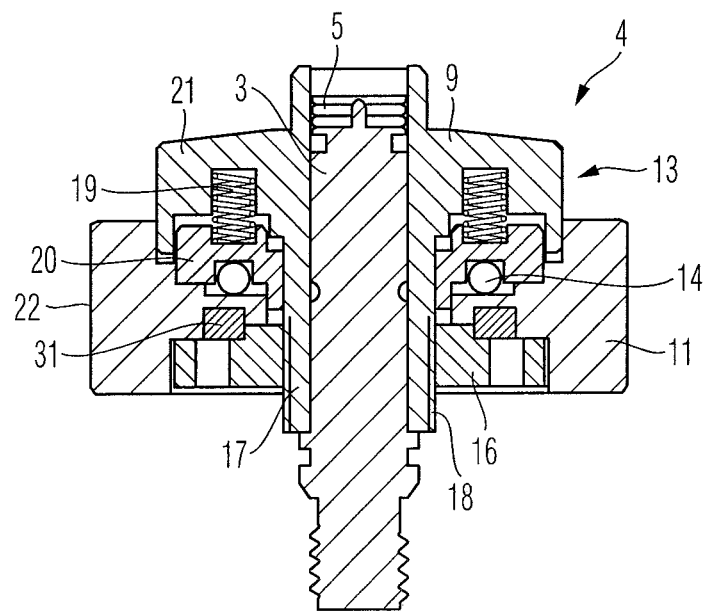
FIG. 4 is a sectional view of the torque limiter according to FIG. 3.

FIG. 4 is a sectional view of the torque limiter according to FIG. 3.

The centering element 9 comprises a central hollow shaft 17 configured for centering the HF coaxial connection element 3. At a distal end, which is configured for connection to a corresponding HF connection element, the hollow shaft 17 comprises an inner thread 5. On the other distal end, the hollow shaft 17 comprises an outer thread 18 configured for securing and axially moving the preloading washer 16. Furthermore, the centering element comprises a flange 21 accommodating one end of the springs 19. In this way, the centering element 9 on one hand defines the position of the HF connecting element 3 and on the other hand acts as a bracket abutting the preload forces of the pressing component 13.

A slide ring 31 is arranged between the guiding element 11 and the washer. The washer 16 can thus even under reload be easily moved axially by screwing it along the outer thread 18 with respect to the flange 21. In this way, the distance between the washer 16 and the flange 21 and thus the spring preload on the balls 14 can be adjusted to calibrate the predetermined torque.

In this way, the torque limiter 4 is configured as a ball detent type limiter providing a frictional connection between the turning wheel 22 and the bearing ring 20 as long as the balls 14 rest in the indentations, in which they are held in place with the springs. The bearing ring 20 is locked against turning on the hollow shaft 17 which transmits the torque to the inner thread 5.

If a predetermined torque is reached, the balls 14 are pushed out of the indentations 12, thereby opening the frictional connection between the turning wheel 22 and the bearing ring 20. In this way, the torque limiter 4 is decoupled when the predetermined torque is reached. The predetermined torque can be adapted by adjusting the spring compression with the washer 16.

Depending on the size and configuration, such a torque limiter may be similarly realized as a roller detent type limiter with rollers instead of the balls.

The indentations 12 may be configured to allow pushing out the balls 14 in one or in both directions. This can be adapted by the form of the sidewalls of the indentations 12. In this way, both an overrunning clutch and a slipping clutch can be realized by means of such a ball or roller detent type limiter.

If the torque limiter 4 is configured as an overrunning clutch, the indentations 12 are configured to allow pushing out the balls 14 only in one direction. In particular, one wall may be sloped and one may be straight. In this way, the torque limiter 4 comprises an overrunning turning direction for closing the connection with the predetermined torque and a blocking turning direction for opening the connection. The overrunning clutch opens when the turning wheel 22 of the torque limiter is turned in the overrunning direction and the predetermined torque is reached. The connection may be opened again by turning the wheel 22 in the opposite blocking direction. In the blocking direction, the overrunning clutch is always blocked and thus allows transmission of higher torque such that the connection can be easily opened.

If the torque limiter 4 is configured as a slip clutch, the indentations 12 are configured to allow pushing out the balls 14 in both directions. In particular, a slip clutch allows slipping in both turning directions of the torque limiter 4. However, the torque transmittable in a closing direction is different from the torque transmittable in an opening direction. This is realized for example by different slopes of the sidewalls of the indentations 12. In this way, the predetermined torque can be applied in a closing direction to close the connection and a higher but still limited torque can be applied in an opening direction to open the connection.

Figure 5:
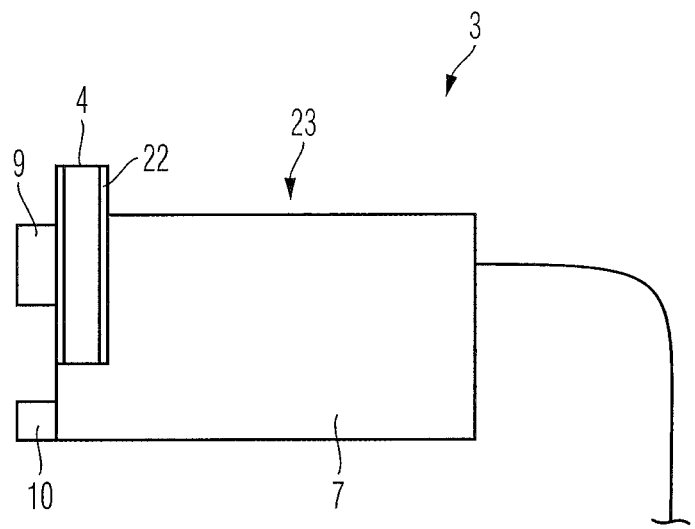
FIG. 5 is a schematic side view of an HF coaxial connection element according to an embodiment.
Figure 6:
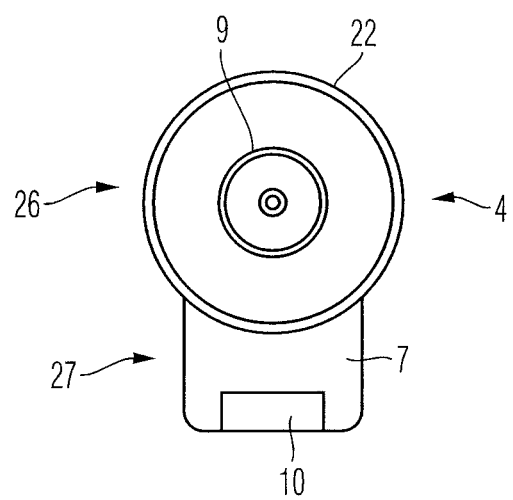
FIG. 6 is a schematic front view of the HF coaxial connection element of FIG. 5.

FIG. 5 is a schematic side view of an HF coaxial connection element 3 according to an embodiment. FIG. 6 is a schematic front view of the HF coaxial connection element of FIG. 5.

The HF coaxial connection element 3 is configured to be connected to a corresponding HF coaxial connection element 8 and comprises an integrated torque limiter 4, an integrated centering element 9 and an integrated twist protection element 10.

The HF coaxial connection element 3 has a special form code and is therefore specially configured to be detachably connected to an HF coaxial connection element 8 with a corresponding form code. Therefore, it comprises an at least partially ring shaped centering element 9 for centering the HF coaxial connection element 3 with respect to the corresponding HF coaxial connection element 8 and a twist protection element 10 for preventing twisting between the HF coaxial connection element 3 and the corresponding HF coaxial connection element 8.

The centering element 9 and the twist protection element 10 are formed together in one part having a keyhole shape. The keyhole shape generally comprises an at least partially circular first section 26 and an at least partially trapezoidal or rectangular second section 27. Corners of the second section may be formed sharp or rounded. In the embodiment of FIG. 6, the second section is formed for example rectangular with rounded corners.

As can be seen in FIG. 5, the torque limiter 4 and the HF connection element 3 are formed integrated within one housing 7. The torque limiter 4 is configured for connecting the HF coaxial connection element 3 with a corresponding HF coaxial connection element 8 with a predetermined torque, as explained in detail with respect to FIGS. 3 and 4.

The housing 7 has a gripping portion 23 and is sized and configured for manual operation. Furthermore, the turning wheel 22 of the torque limiter 4 is configured for manual operation.

Figure 7:
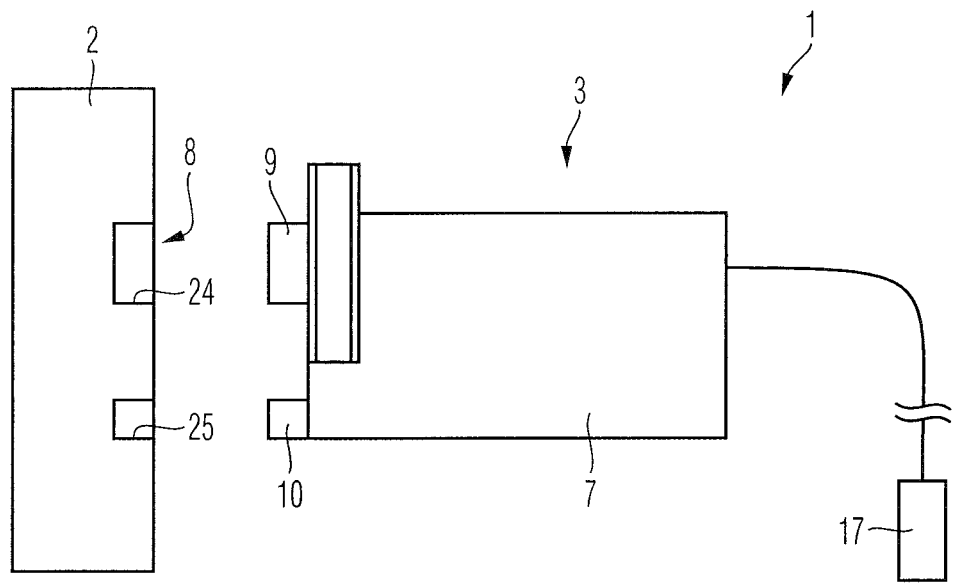
FIG. 7 is a schematic side view of a measurement device and a measurement equipment comprising the HF coaxial connection element according to FIGS. 5 and 6.

FIG. 7 is a schematic side view of a measurement device 2 and a measurement equipment 1 comprising the HF coaxial connection element 3 according to FIGS. 5 and 6.

By means of the gripping portion 23 and the turning wheel 22 both configured for manual operation the measurement equipment 1 can be manually connected to the measurement device 2 without any tool. Thus, the connection may be established toolfree by hand.

In particular, the gripping portion 23 and the turning wheel 22 are arranged next to each other such that the measurement equipment can be connected one-handed. Therefore, the gripping portion may be held with one hand and the turning wheel can be turned at the same time with thumb and forefinger of this hand.

The HF coaxial connection element 3 is connected to a sensor or probe 17, as explained with respect to FIG. 1.

The measurement device 2 comprises at least one connection element 8, preferably a plurality of connection elements 8. The connection element 8 is formed corresponding to the HF connection element 3 of the measurement equipment 1. The measuring equipment 1 of FIG. 7 is connected to a connection element 8 by means of the torque limiter 4 with a predetermined torque.

The connection element 8 has a form code corresponding to the HF connection element 3. In the present example, the connection element 8 comprises a ring shaped first recess 24 corresponding to the circular centering element 9 of FIG. 6 and a second recess 25 arranged radially outside the ring shaped recess 24 corresponding to the form of the twist protection element 10, which is for example rectangular in the embodiment of FIG. 6.

Figure 8:
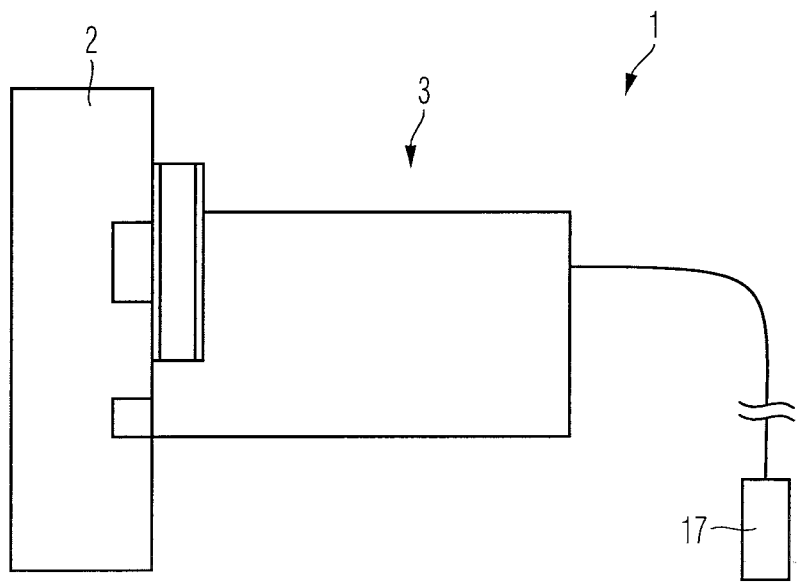
FIG. 8 is a schematic side view of the measurement device and measurement equipment according to FIG. 7 in a connected state.

FIG. 8 is a schematic side view of the measurement device 2 and the measurement equipment 1 according to FIG. 7 in a connected state.

In the connected state, the centering element 9 is accommodated in the first recess 24 and the twist protection element 10 is accommodated in the second recess 25. In this way, the HF connection element 3 is connected to the measurement device 2 and restrained against rotation. Accordingly, a measuring arrangement is provided ready for use.

For example, the measurement device 2 may be configured as a digital oscilloscope. However, other embodiments may comprise other measurement devices.

In addition, further embodiments may comprise other form codes, in particular other shapes of the centering element 9 and/or twist protection element 10 and the respective first and/or second recesses. Furthermore, male and female elements of the measuring equipment and the measurement device may be changed.

For example, in an embodiment the centering element 9 may be formed with a ring shaped protrusion. The twist protection element 10 may be formed with a trapezoidal protrusion.

Furthermore, the turning the wheel 22 may or may not extend through the housing 7. Therefore, a front end of the housing 7 may be formed with a recess between the twist protection element 10 and the centering element 9, in which recess the turning wheel 22 may be accommodated.

Furthermore, the connection elements 8 may comprise a ring shaped recess corresponding to the ring shaped centering element 9 and/or a trapezoidal recess corresponding to the trapezoidal twist protection element.

In another embodiment, the centering element 9 may be formed as a ring shaped recess and/or the twist protection element formed as a rectangular protrusion.

Again, the housing 7 may be formed with a recess at the front end accommodating the turning wheel 22 of the torque limiter 4. Furthermore, the protruding twist protection element may be formed longer than the centering element 9.

Accordingly, the connection element 8 may be adapted to the form code of the HF connection element 3 in that it comprises a ring shaped protrusion corresponding to the centering element and/or a rectangular recess corresponding to the twist protection element 10.

Although specific embodiments of the invention are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It will also be appreciated that in this document the terms "comprise", "comprising", "include", "including", "contain", "containing", "have", "having", and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms "a" and "an" used herein are intended to be understood as meaning one or more unless explicitly stated otherwise. Moreover, the terms "first", "second", "third", etc. are used merely as labels, and are not intended to impose numerical requirements on or to establish a certain ranking of importance of their objects.

LIST OF REFERENCE SIGNS 1 measurement equipment
2 measurement device
3 HF coaxial connection element
4 torque limiter
5 thread
6 counterpart thread
7 housing
8 HF coaxial connection element
9 centering element
10 twist protection element
11 guiding element
12 depression
13 pressing component
14 pressing element
15 connection element axis
16 disc or washer
17 hollow shaft
18 outer thread
19 spring
20 bearing ring
21 flange
22 turning wheel
23 gripping portion
24 first recess
25 second recess
26 first section
27 second section

What we claim is:

1. Measurement equipment configured to be connected to a measurement device, the measurement equipment comprising:
an HF coaxial connection element; and
a torque limiter configured for connecting the HF coaxial connection element with the measurement device with a predetermined torque, wherein the torque limiter comprising:
a guiding element comprising at least two radially arranged indentations; and
a pressing component comprising at least two spring preloaded pressing elements and configured for pressing the least two spring preloaded pressing elements against the at least two indentations,
wherein the guiding element is configured rotatable around an HF coaxial connection element axis with respect to the pressing component, the torque limiter further comprising:
a preloading disc or washer axially movable with respect to the pressing component for adjusting the spring preload on the pressing elements according to a distance to the pressing component.

2. The measurement equipment of claim 1, further comprising a thread, wherein the torque limiter is configured for tightening the thread with a counterpart thread of the measurement device.

3. The measurement equipment of claim 1, wherein the torque limiter is configured as an overrunning clutch.

4. The measurement equipment of claim 1, wherein the torque limiter is configured as a slip clutch.

5. The measurement equipment of claim 1, wherein the torque limiter is configured as a ball or roll detent type limiter.

6. The measurement equipment of claim 1, wherein the HF coaxial connection element and the torque limiter are accommodated together in one housing.

7. The Measurement equipment of claim 1, wherein the pressing component comprises a centering element with a central hollow shaft configured for centering the HF coaxial connection element, wherein the hollow shaft comprises an outer thread configured for securing and axially moving the preloading disc or washer, respectively.

8. The Measurement equipment of claim 7, wherein the centering element comprises a flange for abutting the spring preload of the pressing component, wherein the preloading disc or washer, respectively, is axially movable with respect to the centering element for adjusting the spring preload on the pressing elements according to a distance to the flange.

9. A HF coaxial connection element configured to be connected to a corresponding HF coaxial connection element, the HF coaxial connection element comprising:
a torque limiter configured for detachably connecting the HF coaxial connection element with the corresponding HF coaxial connection element with a predetermined torque, wherein the torque limiter comprising:
a guiding element comprising at least two radially arranged indentations; and
a pressing component comprising at least two spring preloaded pressing elements and configured for pressing the least two spring preloaded pressing elements against the at least two indentations,
wherein the guiding element is configured rotatable around an HF coaxial connection element axis with respect to the pressing component, the torque limiter further comprising:
a preloading disc or washer axially movable with respect to the pressing component for adjusting the spring preload on the pressing elements according to a distance to the pressing component;
a centering element for centering the HF coaxial connection element with respect to the corresponding HF coaxial connection element; and
a twist protection element for preventing twisting motion between the HF coaxial connection element and the corresponding HF coaxial connection element.

10. The HF coaxial connection element of to claim 9, wherein the centering element and the twist protection element are formed together in one part.

11. The HF coaxial connection element of to claim 10, wherein the centering element and the twist protection element are formed together in one part comprising a keyhole shape.

12. The HF coaxial connection element of claim 9, wherein the pressing component comprises a centering element with a central hollow shaft configured for centering the HF coaxial connection element, wherein the hollow shaft comprises an outer thread configured for securing and axially moving the preloading disc or washer, respectively.

13. The HF coaxial connection element of claim 12, wherein the centering element comprises a flange for abutting the spring preload of the pressing component, wherein the preloading disc or washer, respectively, is axially movable with respect to the centering element for adjusting the spring preload on the pressing elements according to a distance to the flange.

14. A torque limiter for a HF coaxial connection element, the torque limiter comprising:
   a guiding element comprising at least two radially arranged indentations; and
   a pressing component comprising at least two spring preloaded pressing elements and configured for pressing the least two spring preloaded pressing elements against the at least two indentations,
   wherein the guiding element is configured rotatable around an HF coaxial connection element axis with respect to the pressing component, the torque limiter further comprising:
   a preloading disc or washer axially movable with respect to the pressing component for adjusting the spring preload on the pressing elements according to a distance to the pressing component.

15. The torque limiter of claim 14, wherein the pressing component comprises a centering element with a central hollow shaft configured for centering the HF coaxial connection element, wherein the hollow shaft comprises an outer thread configured for securing and axially moving the preloading disc or washer, respectively.

16. The torque limiter of claim 15, wherein the centering element comprises a flange for abutting the spring preload of the pressing component, wherein the preloading disc or washer, respectively, is axially movable with respect to the centering element for adjusting the spring preload on the pressing elements according to a distance to the flange.

17. Measurement equipment configured to be connected to a measurement device, the measurement equipment comprising:
   an HF coaxial connection element; and
   a torque limiter configured for connecting the HF coaxial connection element with the measurement device with a predetermined torque, wherein the torque limiter comprising:
   a guiding element comprising at least two radially arranged indentations; and
   a pressing component comprising at least two spring preloaded pressing elements and configured for pressing the least two spring preloaded pressing elements against the at least two indentations,
   wherein the guiding element is configured rotatable around an HF coaxial connection element axis with respect to the pressing component, and
   wherein the HF coaxial connection element is configured to be connected to a corresponding HF coaxial connection element, the HF coaxial connection element comprising: the torque limiter configured for detachably connecting the HF coaxial connection element with the corresponding HF coaxial connection element with a predetermined torque; a centering element for centering the HF coaxial connection element with respect to the corresponding HF coaxial connection element; and a twist protection element for preventing twisting motion between the HF coaxial connection element and the corresponding HF coaxial connection element.

18. A HF coaxial connection element configured to be connected to a corresponding HF coaxial connection element, the HF coaxial connection element comprising:
   a torque limiter configured for detachably connecting the HF coaxial connection element with the corresponding HF coaxial connection element with a predetermined torque, wherein the torque limiter comprising:
   a guiding element comprising at least two radially arranged indentations; and
   a pressing component comprising at least two spring preloaded pressing elements and configured for pressing the least two spring preloaded pressing elements against the at least two indentations,
   wherein the guiding element is configured rotatable around an HF coaxial connection element axis with respect to the pressing component; and
   wherein the HF coaxial connection element is configured to be connected to a corresponding HF coaxial connection element, the HF coaxial connection element comprising: the torque limiter configured for detachably connecting the HF coaxial connection element with the corresponding HF coaxial connection element with a predetermined torque; a centering element for centering the HF coaxial connection element with respect to the corresponding HF coaxial connection element; and a twist protection element for preventing twisting motion between the HF coaxial connection element and the corresponding HF coaxial connection element.

19. A torque limiter for a HF coaxial connection element, the torque limiter comprising:
   a guiding element comprising at least two radially arranged indentations; and
   a pressing component comprising at least two spring preloaded pressing elements and configured for pressing the least two spring preloaded pressing elements against the at least two indentations,
   wherein the guiding element is configured rotatable around an HF coaxial connection element axis with respect to the pressing component, and
   wherein the HF coaxial connection element is configured to be connected to a corresponding HF coaxial connection element, the HF coaxial connection element comprising: the torque limiter configured for detachably connecting the HF coaxial connection element with the corresponding HF coaxial connection element with a predetermined torque; a centering element for centering the HF coaxial connection element with respect to the corresponding HF coaxial connection element; and a twist protection element for preventing twisting motion between the HF coaxial connection element and the corresponding HF coaxial connection element.

* * * * *